United States Patent
Lin

(10) Patent No.: US 7,707,962 B2
(45) Date of Patent: May 4, 2010

(54) APPARATUS FOR FORMING CARBON NANOTUBE FILM

(75) Inventor: Mong-Tung Lin, Tu-Cheng (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 753 days.

(21) Appl. No.: 11/309,431

(22) Filed: Aug. 4, 2006

(65) Prior Publication Data
US 2007/0144431 A1    Jun. 28, 2007

(30) Foreign Application Priority Data
Oct. 14, 2005    (CN) .................... 2005 1 0100356

(51) Int. Cl.
B05B 7/06 (2006.01)
B05B 1/14 (2006.01)
B05C 11/00 (2006.01)

(52) U.S. Cl. .................. 118/313; 118/315; 118/684; 239/550; 239/556; 239/566

(58) Field of Classification Search ......... 118/313–316, 118/684, 692; 239/424, 418, 556, 566, 500; 427/427.1, 421.1, 424
See application file for complete search history.

(56) References Cited

U.S. PATENT DOCUMENTS

| 2,049,700 | A  | * | 8/1936  | Gustafsson ............... 239/8    |
| 3,341,124 | A  | * | 9/1967  | Barnes ..................... 239/8    |
| 5,154,356 | A  | * | 10/1992 | Sorenson ................. 239/550   |
| 6,277,318 | B1 |   | 8/2001  | Bower et al.                         |
| 6,899,288 | B2 | * | 5/2005  | Filicicchia et al. ....... 239/424   |
| 2003/0116654 | A1 | * | 6/2003 | Herd et al. ............... 239/551  |
| 2003/0143315 | A1 | * | 7/2003 | Pui et al. ................. 427/2.1 |
| 2005/0109280 | A1 |   | 5/2005 | Chen et al.                          |

FOREIGN PATENT DOCUMENTS
WO    WO 9113760 A1 *  9/1991

* cited by examiner

Primary Examiner—Yewebdar T Tadesse
(74) Attorney, Agent, or Firm—Clifford O. Chi

(57) ABSTRACT

An apparatus for forming a film of solution of carbon nanotubes includes a retaining member, an array of spray nozzles, and a supply tube. The spray nozzles are mounted on the retaining member. The spray nozzles being in communication with the supply tube. The apparatus can deposit a film of solution of carbon nanotubes having high thickness uniformity.

5 Claims, 10 Drawing Sheets

APPARATUS FOR FORMING CARBON NANOTUBE FILM

TECHNICAL FIELD

The present invention relates generally to nanomaterials, and more particularly to an apparatus for forming a carbon nanotube film.

DISCUSSION OF RELATED ART

Carbon nanotubes have interesting electronic properties that make them potentially useful for electronic devices and for interconnecting applications. Carbon nanotubes also feature high aspect ratios (>1000) and atomically sharp tips that make them ideal candidates for electron field emitters. To realize these potential applications, it is necessary to process nanotubes into useful forms such as thin films, and, advantageously, patterned thin films.

Carbon nanotubes are currently being produced by a variety of different techniques such as arc-discharge, laser ablation and chemical vapor deposition (CVD). (See S. Iijima, Nature, Vol. 354, p. 56 (1991); T. W. Ebbesen and P. M. Ajayan, Nature, Vol. 358, p. 220 (1992); and B. I. Yakobson and R. E. Smalley, American Scientists, Vol. 85, p. 324 (1997)). The deposited material, however, is usually in the form of loose powders, porous mats, or films with poor adhesion. These forms of nanotubes do not lend themselves to the convenient preparation of robustly adherent nanotube thin film structures. The difficulty in preparing an adherent film of nanotubes is believed to be due to the perfect structure associated with carbon nanotubes, which contain essentially no dangling bonds and few defect sites. As a result, nanotube films tend to exhibit poor adhesion, even to the point of being easily removed by contact or by air flow (e.g. an air duster).

To overcome the aforementioned disadvantages, a method for forming an adherent (i.e. one in which the adhesion strength of the film exceeds scale 2A or 2B according to ASTM tape testing method D3359-97.) film of nanotubes has been developed. The method includes the steps of: providing a substrate; forming a patterned intermediate layer on the substrate; spraying a layer of carbon nanotube solution onto the intermediate layer; annealing the intermediate layer and the carbon nanotubes at a high temperature so as to create good adherence between the intermediate layer and the carbon nanotubes being obtained; and removing the nanotubes on the non-patterned area.

The aforementioned method can obtain an adherent film of carbon nanotubes, but the film of carbon nanotubes has poor thickness uniformity due to the use of spraying. Thus, there is a desire to develop an apparatus for forming such a film of carbon nanotubes that having a high level of thickness uniformity.

SUMMARY

In one embodiment, an apparatus for forming a film of carbon nanotubes includes a retaining member, an array of spray nozzles, and a supply tube configured for supplying a carbon-nanotube-containing solution therethrough. The spray nozzles are retained on the retaining member. The spray nozzles are in communication with the supply tube.

This and other features and advantages of the present invention as well as the preferred embodiments thereof and a metal nanowire array and techniques for fabricating metal nanowire array in accordance with the invention will become apparent from the following detailed description and the descriptions of the drawings.

BRIEF DESCRIPTION OF THE DRAWINGS

Many aspects of the present apparatus for forming a film of carbon nanotubes can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views

DETAILED DESCRIPTION OF THE PREFERRED EMBODIMENTS

Figure 1:
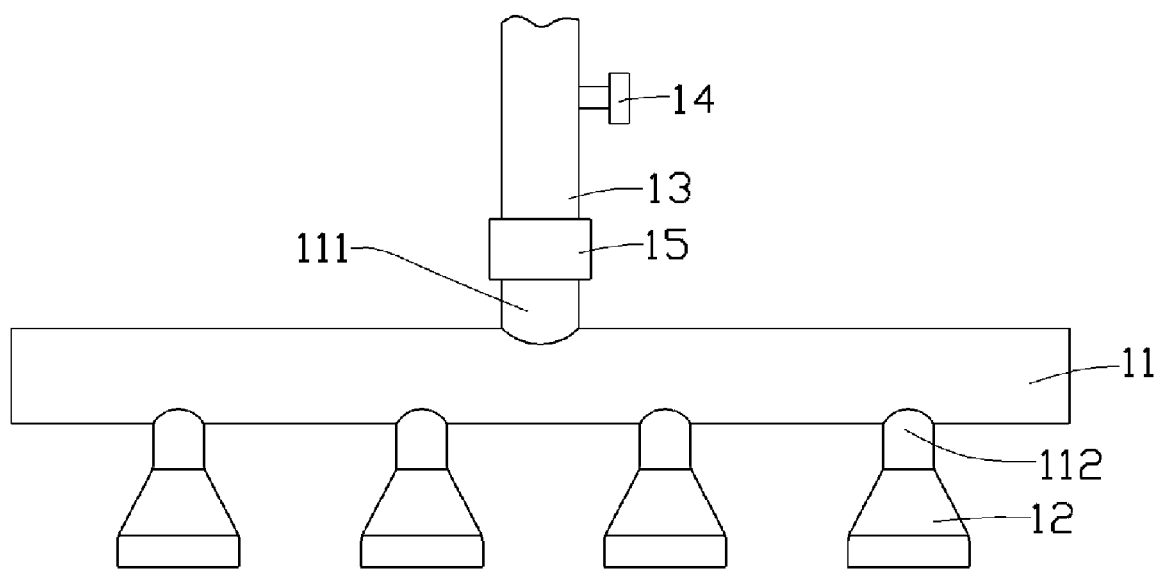
FIG. 1 is a schematic front view of an apparatus for forming a film of carbon nanotubes solution in accordance with a first preferred embodiment.

Referring now to FIG. 1, an apparatus 10 for forming a film of carbon nanotubes in accordance with a first preferred embodiment includes a retaining member 11, a number of spray nozzles 12, and a supply tube 13. The retaining member 11 is a tube with its two ends sealed. The retaining member 11 includes an inlet 111 and a number of outlets 112. The supply tube 13 is in communication with the inlet 111. The spray nozzles 12 are fixed on the retaining member 111. Each of the spray nozzles 12 is in communication with a corresponding outlet 112. For example, the spray nozzles 12 can be threadedly engaged with the retaining member 11 The supply tube 13 is used for supplying a solution of carbon nanotubes to the spray nozzles 12. A valve 14 is mounted on the supply tube 13 for controlling start-up/shut-down of the apparatus 10. Preferably, a mass flow controller 15 is mounted on the supply tube 23 for regulating flux of the solution of carbon nanotubes.

Preferably, each of the spray nozzles is one of a flat-type spray nozzle and an air atomizing flat-type spray nozzle which can produce a rectangular cover area.

In the preferred embodiment, the spray nozzles 12 can spray a solution of carbon nanotubes synchronously through multiple spray nozzles therefore a film of carbon nanotubes solution having high thickness uniformity can be obtained at high speed.

Figure 2:
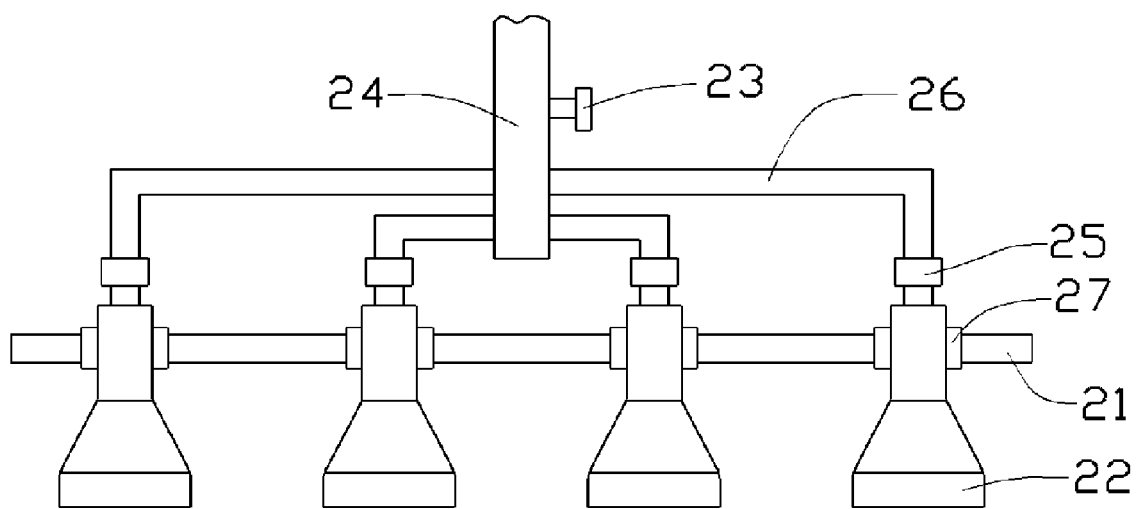
FIG. 2 is a schematic front view of an apparatus for forming a film of carbon nanotubes solution in accordance with a second preferred embodiment.

Referring to FIG. 2, an apparatus 20 for forming a film of carbon nanotubes in accordance with a second preferred embodiment includes a retaining member 21, a number of spray nozzles 22, a supply tube 24, a number of feed tubes 26, and a number of securing members 27. The spray nozzles 22 are fixed on the retaining member 21. For example, the spray nozzles 22 can be welded onto the retaining member 21 or secured by a number of clamping members 27. Each of the spray nozzles 22 is in communication with the supply tube 24 through a corresponding feed tube 26. Preferably, a valve 23 is mounted on the supply tube 24 for controlling start-up/shut-down of the apparatus 20. Preferably, a number of mass flow controllers 25 are provided, each of which is mounted on a respective one of the feed tubes 26. The mass flow controllers 25 are for regulating flow of the solution of carbon nanotubes.

In the preferred embodiment, the flux of carbon nanotubes solution in each of the spray nozzles 22 can be regulated; therefore it can create carbon nanotube solution films of different shapes.

Figure 3:
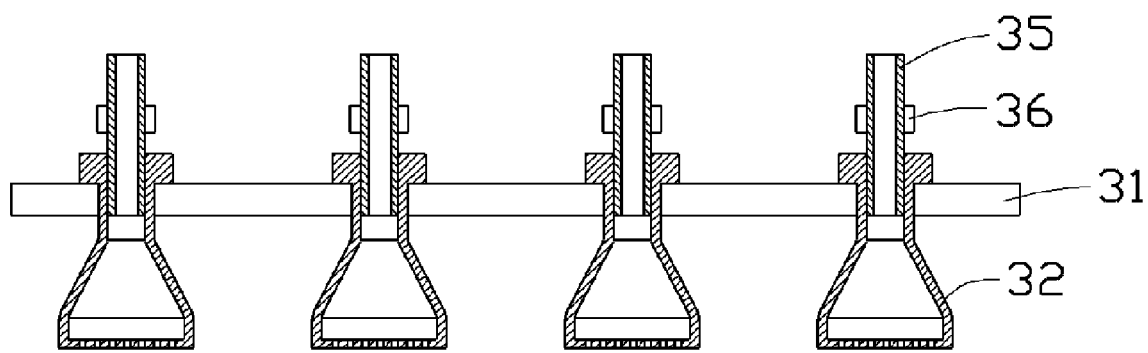
FIG. 3 is a cross sectional schematic view of an apparatus for forming a film of carbon nanotubes solution in accordance with a third preferred embodiment.
Figure 4:
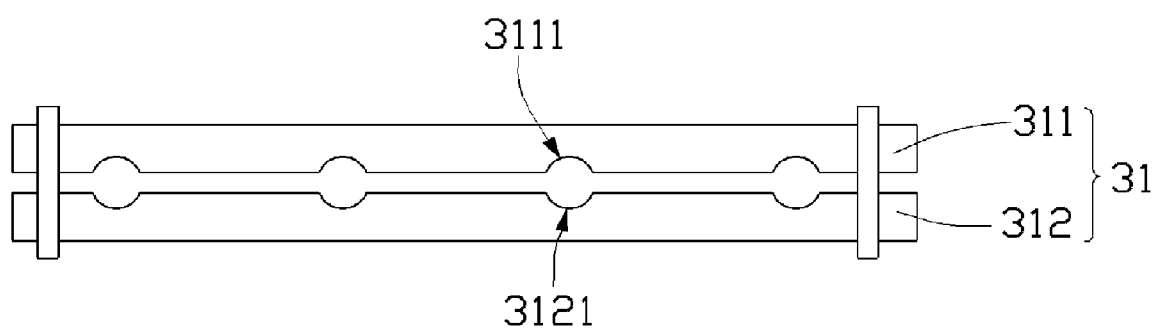
FIG. 4 is a schematic view of the retaining member in FIG. 3.

Referring to FIGS. 3-4, an apparatus 30 for forming a film of carbon nanotubes in accordance with a third preferred embodiment includes a retaining member 31, an array of spray nozzles 32, and a number of feed tubes 35. The retaining member 31 includes a first portion 311 and a second portion 312; and the spray nozzles 32 are clamped between the first portion 311 and the second portion 312. Preferably, a number of first concave surfaces 3111 are formed on the first portion 311, and a number of second concave surfaces 3121 are formed on the second portion 312. Each of the spray nozzles 32 is engaged with one of the first concave surfaces 3111 and a corresponding second concave surface 3121. Each of the spray nozzles 32 is in communication with a corresponding feed tube 35. Preferably, a number of mass flow controllers 36 are provided, each of which is mounted on a respective one of the feed tubes 35. The mass flow controllers 36 are for regulating flux of the solution of carbon nanotubes.

The feed tubes 35 are used for supplying carbon nanotubes solution to a corresponding spray nozzle 32. The feed tubes 35 can be in direct communication with a carbon nanotubes solution source. Alternatively, similar to the second preferred embodiment, a supply tube can be used for supplying carbon nanotubes solution to each of the feed tubes 35.

Figure 5:
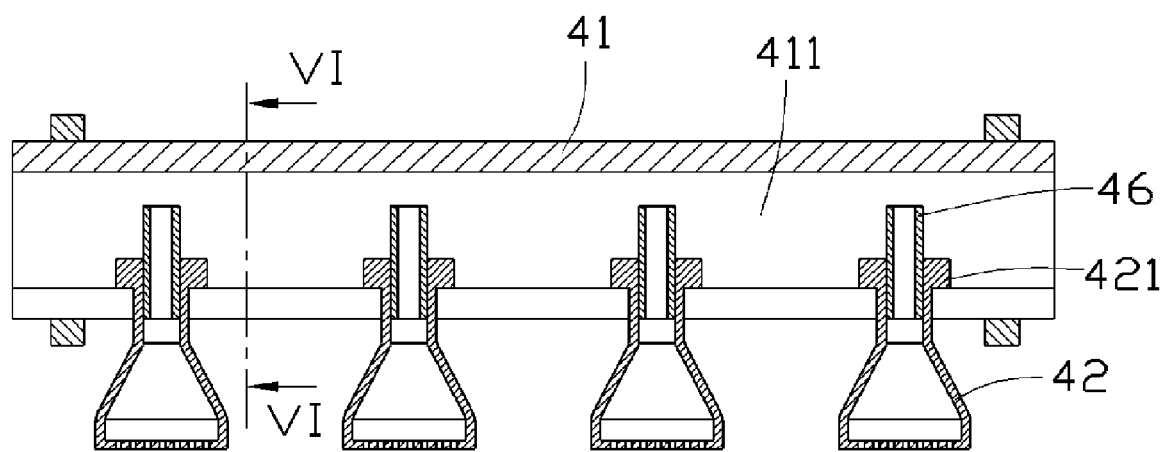
FIG. 5 is a cross sectional schematic view of an apparatus for forming a film of carbon nanotubes solution in accordance with the fourth preferred embodiment.
Figure 6:
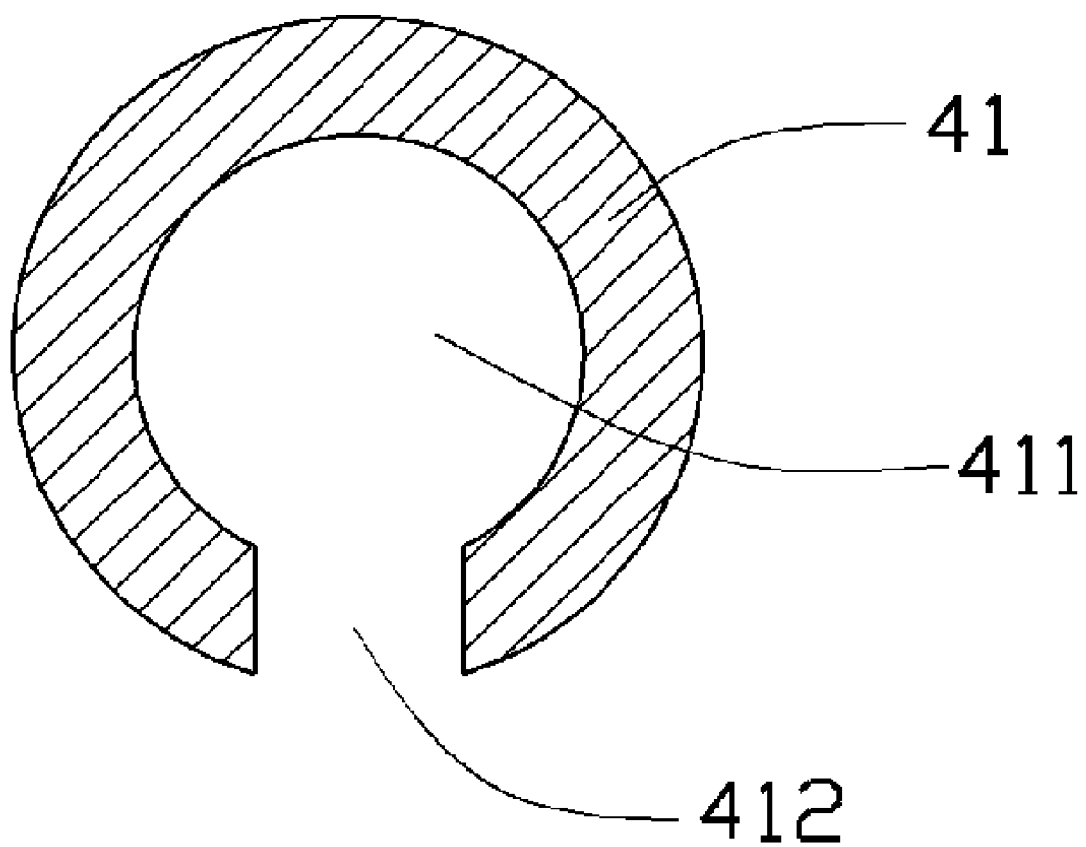
FIG. 6 is a cross sectional view of FIG. 5 along line VI-VI.

Referring to FIG. 5, an apparatus 40 for forming a film of carbon nanotubes in accordance with a fourth preferred embodiment includes a retaining member 41, an array of spray nozzles 42, and a number of feed tubes 46. Referring also to FIG. 6, the retaining member 41 defines a through hole 411 along its longitudinal direction. A slit 412 is formed along the longitudinal direction of the retaining member 41. Each of the spray nozzles 42 includes a fix portion 421. The fix portion 421 is received in the through hole 411. The dimension of the fix portion 421 is bigger than the width of the slit 412 so that the spray nozzles 42 are locked on the retaining member 41. Each of the spray nozzles 42 extends through the slit 412. Each of the spray nozzles 42 is in communication with a corresponding feed tube 46.

Referring now to FIGS. 7A-7D, and taking the apparatus 40 in accordance with the fourth embodiment as example, a method for forming an adherent film of carbon nanotubes having high thickness uniformity includes the steps of:

step 1, providing a flat substrate 50;

step 2, forming a patterned intermediate layer 52 on the substrate 50;

step 3, forming a film of a solution of carbon nanotubes on the substrate 50 and the patterned intermediate layer 52;

step 4, annealing the substrate 50 to form an adherent film of carbon nanotubes on the patterned intermediate layer 52: and step 5, removing the carbon nanotubes deposited directly on the substrate 50.

In step 1, the substrate 50 should be substantially non-reactive with carbon (e.g. not carbide-forming or carbon-dissolving) and should also have a relatively high melting point (typically at 1000° C.). For example, the substrate 50 may be composed of SiO2 (including silicon wafers having an oxidized surface layer), indium tin oxide (ITO), aluminium oxide (Al2O3), copper, and platinum.

Figure 7A:
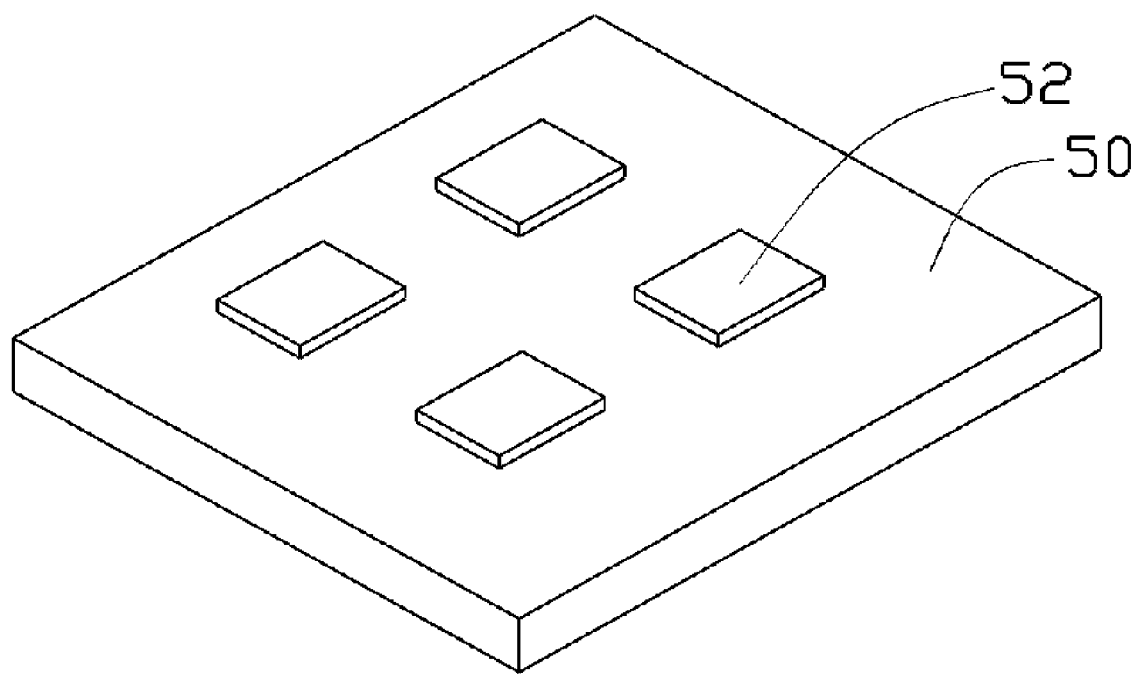
FIGS. 7A-7D are schematic views showing successive stages of the method for fabricating an adherent film of carbon nanotubes using the apparatus of the first preferred embodiment.

In step 2, referring to FIG. 7A, an intermediate layer 52 is deposited onto the substrate 50 in a pattern desired for the nanotube film. The material of the patterned intermediate layer 52 is selected from (a) carbon-dissolving materials, (b) carbide-forming materials, and (c) low melting point (about 700° C. or less) metals. Carbon-dissolving materials are known in the art (for example in T. B. Massalski, Binary Alloy Phase Diagrams, Vol. I, ASM International) and include elements such as nickel, iron, copper, and manganese. Carbide-forming elements are similarly known in the art (see Massalski), and include elements such as silicon, molybdenum, titanium, tantalum, tungsten, niobium, zirconium, vanadium, chromium, and hafnium. Typical low melting point metals include aluminium, tin, cadmium, zinc, and bismuth. The thickness of the patterned intermediate layer 52 is typically 10 to 100 nm. The patterned intermediate layer 52 is deposited by any suitable technique, e.g., sputtering, evaporation, or chemical vapor deposition. Conventional lithographic processes are generally used to provide the desired pattern.

Figure 7B:
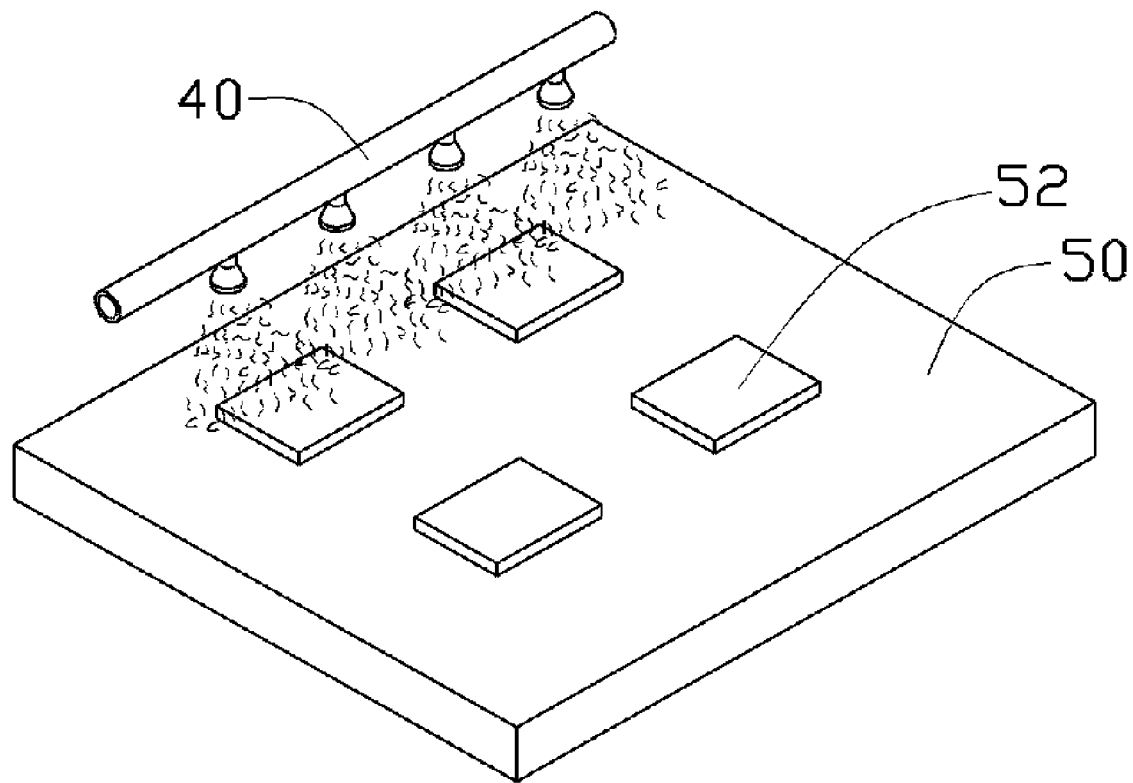

In step 3, referring to FIG. 7B, a solution of carbon nanotubes is then deposited onto the patterned substrate 50 by the apparatus 40. The solution can be prepared by dissolve carbon nanotubes in a solvent of alcohols such as methanol, and ethanol.

Figure 7C:
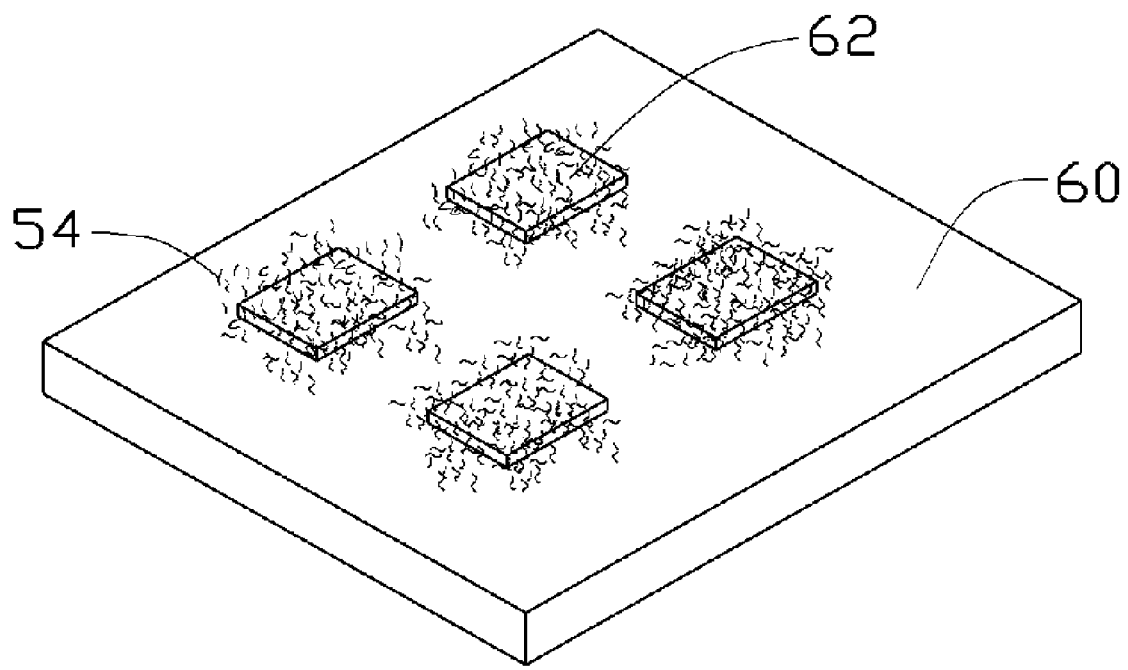

In step 4, the substrate 50 is then annealed, generally in vacuum (10-6 torr or less). The temperature used depends on the material of the patterned intermediate layer 52. Specifically, the temperature chosen can promote carbon dissolution, carbide formation, or melting of the patterning material 52. The annealing step is generally performed for about 30 minutes to 24 hours, depending on the particular patterning material 52. By inducing carbon dissolution, carbide formation or melting at the areas where the nanotubes 54 contact the patterned intermediate layer 52, an area of enhanced adherence between the nanotubes 54 and patterning material 52 is created. Specifically, for carbide-forming material, the material and at least a portion of the nanotubes react to form carbide. For carbon-dissolving material, the material and at least a portion of the nanotubes react to form a metal-carbon solid solution. For low melting point metals, at least a portion of the nanotubes become physically embedded in a molten metal layer and then held in place upon cooling. Referring to FIG. 7C, after the annealing step, the solvent is evaporated, and the carbon nanotubes 54 are attached on the substrate or patterning materials 52. (Only a few nanotubes are shown for illustrative purposes in FIG. 7C. in practice, nanotubes coverage would be much more dense.)

Figure 7D:
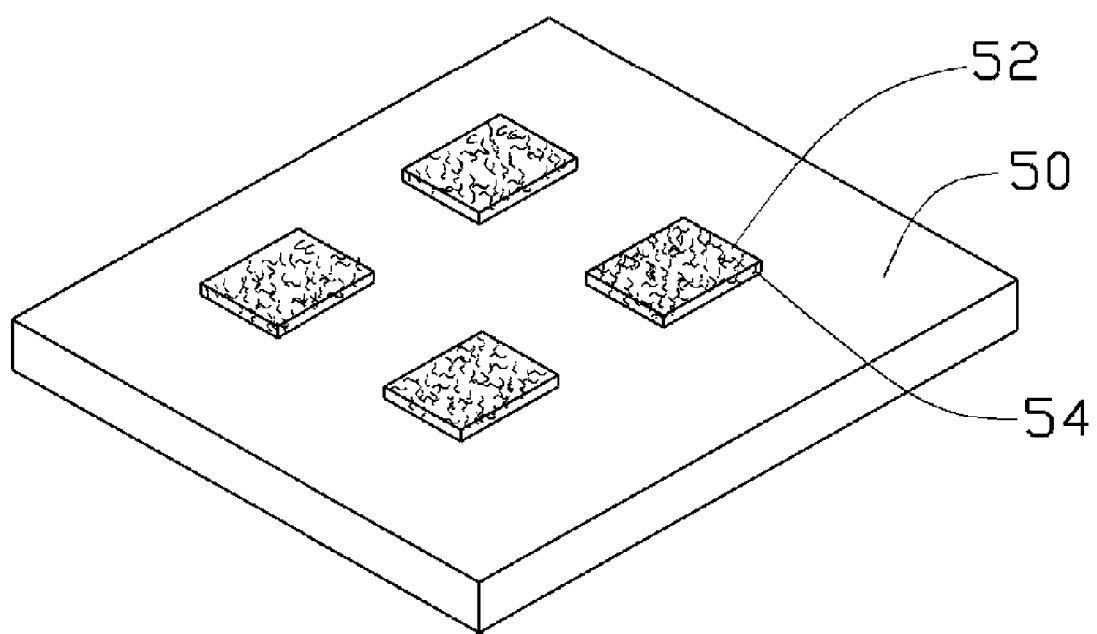

Referring to FIG. 7D, the nanotubes 54 deposited directly on the substrate 50 are removed after annealing therefore a patterned film of carbon nanotubes is obtained. Because the nanotubes have relatively poor adherence to the substrate 50 material, removal is relatively easy. Removal may be performed by blowing, rubbing, or brushing the surface of the substrate 50, or by ultrasound in a solvent such as methanol. Typically, the substrate is treated with ultrasound without the need for other processes such as blowing, rubbing, or brushing. Ultrasound treatment, when performed without any other removal technique, is generally performed for 0.5 to 24 hours.

The thickness of the resultant adherent, patterned nanotube film is generally 100 to 1000 nanometers. The adhesion strength of the resultant patterned nanotube films is sufficient to exceed the 2A or 2B scale in the ASTM tape test D3359-97.

Preferably, before the annealing step, the solvent is evaporated in air or in vacuum (10-6 torr or less).

The patterned nanotube films are useful in a variety of applications, including vacuum microelectronic devices such as flat panel displays, as well as novel applications such as interconnects in silicon-based devices.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. An apparatus for forming a carbon nanotube film, the apparatus comprising:
   a retaining member,
   an array of spray nozzles, and
   a supply tube configured for supplying a carbon-nanotube-containing solution therethrough, the spray nozzles being retained on the retaining member, the spray nozzles being in communication with the supply tube, the retaining member comprising a slit defined therein, the retaining member further comprising a through hole defined therein along a longitudinal direction thereof, each of the spray nozzles including a fixing portion received in the through hole, each spray nozzle being retainably engaged in the slit, a plurality of feed tubes, each of the spray nozzles being in communication with the supply tube through the corresponding feed tube.

2. The apparatus as claimed in claim 1, further comprising a valve mounted on the supply tube.

3. The apparatus as claimed in claim 1, further comprising a mass flow controller mounted on the supply tube.

4. The apparatus as claimed in claim 1, wherein each of the spray nozzles is one of a flat-type spray nozzle and an air atomizing flat-type spray nozzle configured for producing a rectangular spray covering area.

5. The apparatus as claimed in claim 1, wherein each of the spray nozzles further comprises a mass flow controller configured for regulating the flow of the carbon-nanotube-containing solution therethrough.

* * * * *